(12) United States Patent
Miyoshi et al.

(10) Patent No.: US 9,627,598 B2
(45) Date of Patent: Apr. 18, 2017

(54) LIGHT EMITTING DEVICE

(71) Applicant: NICHIA CORPORATION, Anan-shi, Tokushima (JP)

(72) Inventors: Tomonori Miyoshi, Tokushima (JP); Kenji Ozeki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/743,423

(22) Filed: Jun. 18, 2015

(65) Prior Publication Data

US 2015/0380622 A1    Dec. 31, 2015

(30) Foreign Application Priority Data

Jun. 27, 2014  (JP) ................................. 2014-133025
May 14, 2015  (JP) ................................. 2015-099116

(51) Int. Cl.
*H01L 33/64*    (2010.01)
*H01L 33/08*    (2010.01)
(Continued)

(52) U.S. Cl.
CPC .............. *H01L 33/64* (2013.01); *H01L 24/97* (2013.01); *H01L 25/0753* (2013.01); *H01L 33/08* (2013.01); *H01L 33/486* (2013.01); *H01L 33/58* (2013.01); *H01L 33/60* (2013.01); *H01L 2924/19107* (2013.01); *H01L 2933/0033* (2013.01); *H01L 2933/0058* (2013.01); *H01L 2933/0091* (2013.01)

(58) Field of Classification Search
CPC ....... H01L 33/08; H01L 33/486; H01L 33/58; H01L 33/64
See application file for complete search history.

(56) References Cited

U.S. PATENT DOCUMENTS 7,273,987 B2 *   9/2007  Becker ................. H05K 1/0204
                                                         174/252
2006/0091415 A1 * 5/2006  Yan .......................... H01L 33/60
                                                         257/99
(Continued)

FOREIGN PATENT DOCUMENTS

JP    2009-212134 A    9/2009
JP    2010-080830 A    4/2010
(Continued)

OTHER PUBLICATIONS

Extended European Search Report of the corresponding European Patent Application No. 15173592.5, dated Dec. 8, 2015.

*Primary Examiner* — Matthew Reames
(74) *Attorney, Agent, or Firm* — Global IP Counselors, LLP

(57) ABSTRACT

A light emitting device has: a plurality of light emitting elements, a base having a first main surface and a second main surface on the opposite side from the first main surface, the base having conductive patterns disposed on the first main surface on which the light emitting elements are mounted, conductive patterns disposed on the second main surface, and a groove provided on the second main surface of the base corresponding to a space between the light emitting elements, and a light reflecting member that integrally covers side surfaces of the plurality of light emitting elements.

22 Claims, 6 Drawing Sheets

(51) Int. Cl.
   *H01L 33/48*      (2010.01)
   *H01L 33/58*      (2010.01)
   *H01L 33/60*      (2010.01)
   *H01L 25/075*     (2006.01)
   *H01L 23/00*      (2006.01)

(56)                References Cited

U.S. PATENT DOCUMENTS

| | | | |
|---|---|---|---|
| 2006/0243986 A1* | 11/2006 | Wall, Jr. | H01L 33/62 |
| | | | 257/79 |
| 2007/0247855 A1* | 10/2007 | Yano | H01L 33/641 |
| | | | 362/294 |
| 2010/0320479 A1* | 12/2010 | Minato | H01L 33/505 |
| | | | 257/88 |
| 2011/0297994 A1 | 12/2011 | Sugizaki et al. | |
| 2013/0077295 A1 | 3/2013 | Hayashi et al. | |
| 2013/0240922 A1 | 9/2013 | Yamamoto | |
| 2013/0307014 A1 | 11/2013 | Yamamoto et al. | |
| 2013/0329425 A1* | 12/2013 | Lowes | H01L 33/502 |
| | | | 362/235 |
| 2015/0295141 A1 | 10/2015 | Schwarz et al. | |

FOREIGN PATENT DOCUMENTS

| | | |
|---|---|---|
| JP | 2010-157638 A | 7/2010 |
| JP | 2011-253999 A | 12/2011 |
| JP | 2013-074050 A | 4/2013 |
| WO | 2007-000695 A2 | 1/2007 |
| WO | 2014-072256 A1 | 5/2014 |

* cited by examiner

LIGHT EMITTING DEVICE

CROSS-REFERENCE TO RELATED APPLICATIONS

This application claims priority to Japanese Patent Applications Nos. 2014-133025 and 2015-99116 filed on Jun. 27, 2014 and May 14, 2015. The entire disclosure of Japanese Patent Applications Nos. 2014-133025 and 2015-99116 is hereby incorporated herein by reference.

BACKGROUND

Technical Field

The present disclosure relates to a light emitting device having a plurality of light emitting elements.

Related Art

Because they have such good directionality and high luminance, semiconductor light emitting elements have been used in the past not only in illumination light sources serving as alternatives to fluorescent lamps, but also as light sources in signaling devices, transportation-use display devices, display devices that are installed outdoors, and headlights in vehicles.

In one known light emitting device in which a semiconductor light emitting element such as this is used, the light emitting element is mounted on a board having wiring. For example, with the light emitting device proposed in JP2009-212134A, aluminum nitride, which has good heat dispersal properties, is used in the board of a package, and this aluminum nitride board includes a front electrode and a rear electrode that are electrically connected by a via that passes through the board.

On the one hand, there is a need for a light emitting device to offer high luminance recently, but depending on the application, there is also a need for very small light emitting devices in which the emission surface area is made smaller, so as to facilitate the design of light distribution. To this end, development has been underway in recent years on chip-size packages (CSP) in which the planar size of the package is about the same as that of a light emitting element. Furthermore, there is a need for a plurality of CSPs to be mounted at high density on a mounting board to facilitate the design of light distribution.

SUMMARY

The present disclosure relates to a light emitting element. The light emitting device has a plurality of light emitting elements, a base having a first main surface and a second main surface on the opposite side from the first main surface, the base having conductive patterns disposed on the first main surface on which the light emitting elements are mounted, conductive patterns disposed on the second main surface, and a groove provided on the second main surface of the base corresponding to a space between the light emitting elements, and a light reflecting member that integrally covers side surfaces of the plurality of light emitting elements.

The present disclosure relates to anther light emitting element. The light emitting device has; a plurality of light emitting elements, a plurality of bases each having a first main surface and a second main surface on the opposite side from the first main surface, each of the bases having conductive pattern disposed on the first main surface on which the light emitting elements are mounted, at least one base having a heat dissipation pattern disposed on the second main surface, a light reflecting member that integrally covers side surfaces of the plurality of light emitting elements, and conductive members electrically connecting the conductive patterns disposed on the plurality of the bases.

Further, the present disclosure relates to a method of manufacturing a light emitting device. The method has providing a base having a first main surface and a second main surface on the opposite side from the first main surface, the base having conductive patterns disposed on the first main surface, conductive patterns disposed on the second main surface, mounting a plurality of light emitting elements on the conductive patterns on the first main surface, forming a light reflecting member that integrally covers side surfaces of the light emitting elements, and forming at least one groove on the second main surface of the base that corresponds to a space between the light emitting elements.

With the light emitting device pertaining to an embodiment of the present invention, a plurality of CSPs are arranged uniformly and at the smallest spacing possible, while it is still possible to provide a reliable light emitting device that has good heat dissipation and no joining defects or the like.

DETAILED DESCRIPTION OF THE INVENTION

Figure 1A:
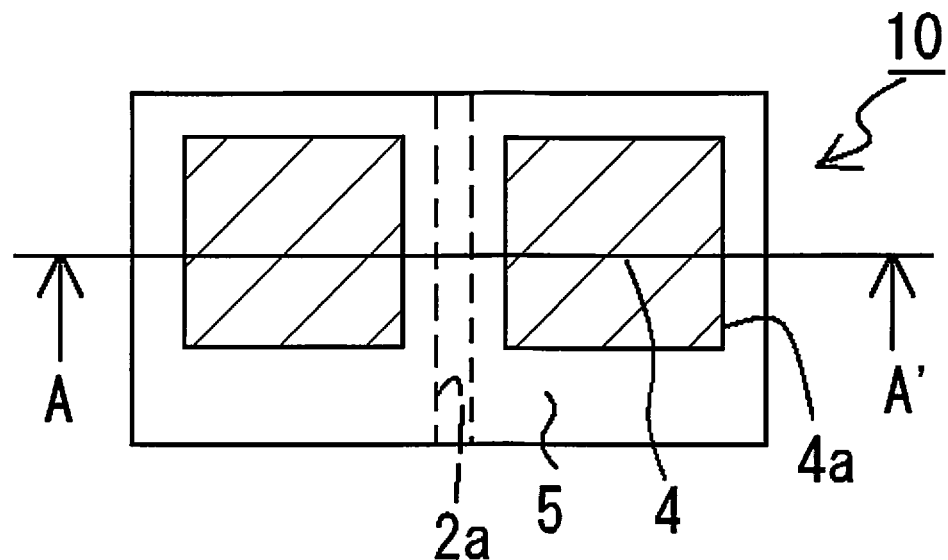
FIG. 1A is a simplified plan view of the light emitting device in Embodiment 1 of the present disclosure.

The inventors conducted painstaking research into the development of a light emitting device that is small, thin, and offers extremely high luminance. As a result, it was ascertained that when a plurality of light emitting devices are mounted at high density on a mounting board, and especially when the light emitting devices are very small in size, arranging these so that they are spaced evenly with no gaps demands an extremely high level of precision, which is difficult to achieve. On the other hand, it was found that when a light emitting device in which a plurality of light emitting elements are mounted at high density on the same base is mounted on a mounting board, the heat cycle load during or after mounting on a mounting board or a circuit board using a joining member causes separation of the joining member due to the difference in the coefficient of linear expansion between the substrate and the mounting board, leading to wiring discontinuity, short circuiting, and the like. This phenomenon is particularly pronounced when the base of the light emitting device is larger. In view of this, the present invention was perfected upon discovering that even with a light emitting device with high luminance and a relatively small size, the reliability can be improved by effectively absorbing or releasing thermal expansion and contraction between the light emitting element, the base, the joining member, the mounting board, and so forth caused by the heat cycling.

The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. Moreover, constitutions described in some of examples and embodiments can be employed in other examples and embodiments.

In the specification, the term "upper", "lower", "first main surface" and "second main surface" also mean a light extraction face side and the opposite side from the light extraction face side, respectively. For example, the upper surface and the first main surface are the light extraction face of the light emitting device, whereas the lower face and the second main surface are the opposite side from the side mentioned above.

The light emitting device in this embodiment includes a base having a conductive pattern, a plurality of light emitting elements mounted on the conductive pattern, and a light reflecting member that integrally covers the side surfaces of the plurality of light emitting elements.

The base, light emitting elements, and light reflecting member usually constitute a single light emitting device. This light emitting device has a groove on the second main surface thereof, between the light emitting elements.

Base

The base is used to mount a plurality of light emitting elements, and includes a first main surface on which the light emitting elements are mounted, and a second main surface on the opposite side from this first main surface.

This base is known in this field, and any base that is used for the mounting of light emitting elements and the like can be used here. The base is usually composed of conductive pattern and a base body that supports this. Examples of the material of the base body include glass epoxy, resin, ceramics (HTCC, LTCC), and other such base bodies composed of insulating materials, and metal members and the like on which an insulating member has been formed. Of these, one that is good heat resistant and weather resistant, and one that has high thermal conductivity is preferable. For instance, one with a thermal conductivity of about 20 W/m·k or higher is preferable, 30 W/m·k or higher is more preferable, 50 W/m·k or higher, or 100 W/m·k or higher is still more preferable. It is particularly preferable for the base body to be formed from an insulating material whose thermal conductivity is higher than that of the light reflecting member discussed below. For example, its thermal conductivity is preferably at least 2 W/m·k higher, at least 3 W/m·k higher, at least 5 W/m·k higher or at least 10 W/m·k higher than that of the light reflecting member. Using a base body such as this allows heat generated from the light emitting elements to be dissipated efficiently.

More specifically, it is preferable to use a ceramic. Examples of ceramics include alumina, aluminum nitride, and mullite. These ceramics may be combined with a BT resin, glass epoxy, an epoxy resin, or another such insulating material.

The thickness of the base body is usually from about 100 μm to 1 mm. When heat dissipation and the electrical contact of the conductive patterns on the first main surface and second main surface are taken into account, about 300 to 700 μm is preferable.

The base has at least one groove on the second main surface side which is the opposite side from the first main surface, correspond to a space between the light emitting elements. This groove may be formed in just part of the thickness direction of the base body from the second main surface side, or may be formed to a depth that reaches the first main surface side from the second main surface side, that is, to a depth that reaches the first main surface side from the second main surface side. That is, the base has a partial groove while the light emitting elements are mounted, and the groove may be integrally linked to the base without reaching the first main surface side, or the groove may be formed to a depth that reaches the first main surface side, thus the base may be divided by the groove into a plurality of segments. In other words, the base constituting a single light emitting device may be a single member with at least one groove formed on the second main surface side, or a plurality of flat bases may be arranged with tiny, uniform gaps in between them. In this Specification, a groove is formed to a depth that reaches the first main surface side, that is, the gap between bases when the base has been divided up will also be described as a "groove."

In any case, since a plurality of light emitting elements are mounted on the first main surface side of the base, and the side surfaces of these light emitting elements are covered by a light reflecting member discussed below, the base, the light emitting elements, and the light reflecting member are configured as an integral light emitting device.

The width of the groove is preferably wide enough to absorb or release the expansion and contraction, of the base itself including the conductive pattern and/or the base body due to the thermal cycle in consideration of heat generation and dissipation by and from the light emitting elements. More specifically, an example is a width of about 10 to 200 μm, and preferably about 100 μm.

From the same perspective as above, the width of gaps between which a plurality of bases are arranged through the gaps, may be equivalent to the above mentioned width of the grooves.

The depth of the groove is preferably the same as the thickness of the base, and when it is less than the thickness of the base, an example is 50% or more, 70% or more, 80% or more, 90% or more, 98% or more, or 100% of the total thickness of the base body, depending on the type and thickness of the base body. Linking in the thickness direction of the base body is preferably sufficient to allow the base body to be divided up by the stress generated by the above-mentioned expansion and contraction of the base body itself. Consequently, when this stress is applied, the base body can be intentionally split up so that the stress is effectively released.

The groove can be formed by a method known in this field, such as laser processing, scribing, or dicing with a blade.

The base has the base body and a conductive pattern. The conductive pattern is preferably disposed on both the first main surface and the second main surface. Furthermore, it may be disposed on a side surface adjacent to both the first main surface and the second main surface. Alternatively, a via may be formed that extends to both the first main surface and the second main surface, that is, that goes through the base body. This electrically connects the conductive pattern of the first main surface with the conductive pattern of the second main surface. The "first main surface" here means the face on which the light emitting elements are mounted, and the second main surface on the opposite side from the first main surface is the face on the opposite side from the emission surface of the light emitting device.

As discussed above, when the conductive pattern is disposed at the base body where the groove is formed, this conductive pattern may also be divided with the base body. The conductive pattern is preferably disposed on both the first main surface and the second main surface of the base body, a first conductive pattern on the first main surface and a second conductive pattern which is located directly under the first conductive pattern and is disposed on the second main surface, and the two of them are electrically connected, but all the conductive patterns may not be electrically connected. Also, the conductive patterns may be disposed so that they can function as a pair of terminals corresponding to a single light emitting element. Furthermore, the conductive patterns may be disposed so that a plurality of light emitting elements can be independently driven by power supply control or the like, or may be disposed so that a plurality of light emitting elements can be driven all together. Independent driving is known in this field, and any commonly used configuration and method can be utilized. When the conductive pattern is not disposed at first main surface of the base body where the groove is formed, or the conductive pattern is disposed at the base body and this conductive pattern is divided, a plurality of conductive patterns on which a plurality of light emitting elements are respectively mounted may be electrically connected by a conductive member in order for the elements to be driven all together. Examples of the conductive member include a wire, a conductive ribbon, a conductive silicone paste or other such conductive material.

Because the base has at least one groove, electrical connection to the mounting board of the light emitting device can be ensured even when a single light emitting device having a large emission surface on which a plurality of light emitting elements are arranged is mounted on the mounting board. That is, even if the mounting board expands or contracts due to heat generated by individual light emitting elements, thermal hysteresis during mounting, or other such factors, this stress can be dispersed and released by the groove of the base. As a result, joining defects such as joining separation caused by the expansion and contraction inherent to the materials that make up the light emitting elements, the base, the joining member, and so forth can be effectively prevented.

The width of the groove is, for example, about the thickness of the base, or less, and preferably no more than one-half the thickness of the base, and more preferably no more than one-fourth the thickness of the base. When the mounting board has a curved surface, then at least one-tenth is even more preferable.

The groove may not be disposed between all of the light emitting elements. For instance, when the light emitting elements are arranged in a matrix, the number and shape of the grooves can be suitably selected according to the type and size of the base and the light emitting elements. As an example, the groove can be formed in just one direction.

Light Emitting Element

The light emitting element 1 is usually a light emitting diode. The composition, emission color and wavelength, size, quantity, and so forth of the light emitting elements can be suitably selected according to the intended purpose. For example, ZnSe, a nitride semiconductor ($In_XAl_YGa_{1-X-Y}N$, $0 \leq X$, $0 \leq Y$, $X+Y \leq 1$), GaP or another such semiconductor layer can be used as blue and green light emitting elements, and GaAlAs, AlInGaP or another such semiconductor layer can be used as red light emitting element.

The light emitting element is usually formed by lamination of a semiconductor layer over a growth substrate such as a sapphire substrate. The growth substrate may have texturing on the face that is joined with the semiconductor layer. This intentionally changes the critical angle when light emitted from the semiconductor layer radiate the substrate, and allows the light to be easily extracted to the outside of the substrate.

The growth substrate may be removed from the light emitting element after the lamination of the semiconductor layer. This removal can be accomplished, for example, by polishing, LLO (laser lift-off), or the like.

The light emitting element may have a pair of positive and negative electrodes on the same side. This allows the light emitting element to be flip-chip mounted to a base having a conductive pattern. In this case, the face that is opposite the face where the pair of electrodes is formed becomes the light extraction face. Flip-chip mounting involves the use of a metal bump such as Au, Cu, a conductive paste-form joining member such as solder, a thin-film joining member, or the like, and the electrical connection of the light emitting element with the conductive pattern of the base. Alternatively, in face-up mounting, the face on which the pair of electrodes is formed may serve as the light extraction face.

The light emitting element may have the pair of positive and negative electrodes on different sides. In this case, one of the electrodes is bonded to the base with a conductive adhesive, and the other electrode is connected to the base with a conductive wire or the like.

A plurality of light emitting elements are included in a single light emitting device. The light emitting elements are arranged, and for example, they may be arranged in a single row, or may be arranged in a matrix. The number of light emitting elements can be suitably selected according to the characteristics, size, and so forth of the light emitting device to be obtained.

The arranged light emitting elements are preferably close together, and when automotive applications, and especially luminance distribution and so forth, are taken into account, the distance between light emitting elements may be about 5 to 50% of the length of the longest side of the light emitting elements, and preferably about 5 to 30%, and more preferably about 5 to 20%. Thus disposing the light emitting elements close together ensures a good, uniform luminance distribution. As a result, the light emitting device can be used as a planar light source with good emission quality and little emission unevenness.

Light Reflecting Member

The light reflecting member covers the side surfaces of the light emitting elements. The phrase "the side surfaces of the light emitting elements" here refers to at least part of the thickness direction of the side surfaces of the semiconductor layer, and preferably all of the thickness direction of the semiconductor layer and/or part of the outer periphery of the side surfaces of the semiconductor layer, and more preferably the entire side surfaces around the outside of the semiconductor layer. A separate layer of an adhesive, an embedded member, or the like may be interposed between the semiconductor layer and the light reflecting member at the side surfaces of the light emitting elements, but it is preferable for the light reflecting member to be contacting the semiconductor layer. It is preferable for all of the outer peripheral side surfaces of the light emitting elements to be integrally covered by the light reflecting member. Consequently, the light emitted from the light emitting elements will be reflected inside the light emitting elements at the interface between the light emitting elements and the light reflecting member. As a result, the light will not be absorbed by adjacent light emitting elements, and will instead be efficiently emitted to the outside from the upper surfaces of the light emitting elements. The light emitting elements can be arranged uniformly and spaced as closely together as possible, while allowing a good luminance distribution to be obtained. Also, as discussed above, even though the base has grooves, it can be easily handled as a single light emitting device.

The light reflecting member preferably covers not only the side surfaces of the light emitting elements, but also at least part of the first main surface of the base. Consequently, as discussed above, the base can be integrally configured regardless of whether is only one or more than one. It is particularly preferable for the light reflecting member to cover the first main surface of the base around the outside of the light emitting elements. When the grooves reach the first main surface side of the base, the face of the light reflecting member on the base side in between the bases may coincide with the first main surface of the base, or may be recessed to the light reflecting member side.

Furthermore, the base-side surface of the light reflecting member between bases may be covered by a separate member. For example, When the light reflecting member or a light blocking member or the like is disposed in a groove, there will be less leakage of light to the base side.

The light reflecting member that covers the side surfaces of the light emitting elements, that is, the light reflecting member disposed in between the light emitting elements, can be flush with the upper surfaces of the light emitting elements (the light extraction faces). The term "flush" here means that some difference in height is permitted, such as about ±10% of the thickness of the light reflecting member, and preferably about ±5%.

When a light transmissive member that covers the upper surfaces of the light emitting elements as discussed below is further provided, the light transmissive member and the light reflecting member are preferably flush on the upper surface side.

The length of the light reflecting member between the light emitting elements is preferably equal to the distance between the light emitting elements, such as about 10 to 500 µm, more preferably about 100 to 300 µm, and still more preferably about 50 to 200 µm or about 100 to 200 µm. Setting such a length allows light leakage from the light emitting elements to the side surface side to be kept to a minimum even though the adjacent light emitting elements are not far apart. Then, the light emitting device can realize more efficient light reflection. As a result, good luminance distribution can be ensured.

The light reflecting member is formed from a material that is able to reflect the light emitted by the light emitting elements. Therefore, the light emitted by the light emitting elements can be reflected inside the light emitting elements at the interface between the light emitting elements and the light reflecting member. As a result, the light propagates within the light emitting elements, and ultimately can be emitted to the outside at the upper surface of the light transmissive member from the upper surfaces of the light emitting elements.

Also, when the light emitting elements are independently driven and turned on and off states between adjacent light emitting elements, it will be less likely that. a light emitting element looks as if a lit state by being subject to light from a lit light emitting element despite the light emitting element is actually unlit state.

That is, there will be less light leakage between the light emitting elements.

It is usually preferable for the light reflecting member to include a resin. The light reflecting member may be formed using a resin include a resin containing at least one type among silicone resins, modified silicone resins, epoxy resins, modified epoxy resins and acrylic resins, or a hybrid resin, and a light reflecting substance. Of there, a resin containing a silicone resin as a base polymer is preferred from the view point of heat resistance, good electrical insulation properties, and flexibility. Thus, it is possible to absorb the above-mentioned stress due to expansion and contraction of the base.

Examples of the light reflecting substance include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride and mullite. Of these, titanium oxide is preferred from the view point of stability with respect to water and high refractive index.

The amount in which the light reflecting substance is contained can be suitably adjusted as dictated by the targeted characteristics and so forth of the light emitting device, since the amount of light reflected and transmitted and so forth by the light reflecting member can be varied. For example, the amount of the light reflecting substance may be preferably 15 wt. % or more, and more preferably 30 wt. % or more with respect to the total weight of the light reflecting member.

The light reflecting members disposed between the light emitting elements may further include a light blocking member between light reflecting members in between light emitting elements. Disposing a light blocking member between light reflecting members in between light emitting elements further reduces the effect of light leakage between light emitting elements. Also, light leakage can be easily suppressed even though the distance between light emitting elements is further reduced.

An example of a light blocking member is the above-mentioned light reflecting member that contains a light absorbent substance. Examples of light absorbent substances include black pigments and carbon black.

As discussed above, when the conductive member such as a wire is disposed for electrically connecting the conductive patterns together, such conductive member may be embedded in the light reflecting member. The conductive member is preferably embedded in the light reflecting member so as not to be exposed on the outer surface of the light emitting device. This prevents shorting and other such problems in the light emitting device caused when solder or another joining member intrudes in the groove during the mounting of the light emitting device to the mounting base, and the conductive member links up with the solder.

The light reflecting member may be a material that has a good heat dissipation property in addition to light reflectivity. The thermal conductivity of the light reflecting member is preferably 0.2 W/m·K or more, more preferably 1 W/m·K or more, and still more preferably 2 W/m·K or more. Using a material having high thermal conductivity improves heat dissipation. Examples of such a material include boron nitride and aluminum nitride which are high thermal conductivity.

For example, as will be discussed below, when the light transmissive member contains a phosphor, the phosphor may generate heat by its-self due to the stoke loss, and this heat can lower the optical conversion efficiency. On the other hand, when the light reflecting member has a high thermal conductivity, the heat of the phosphor in the light transmissive member can be efficiently dissipated.

The light reflecting member can be formed by injection molding, potting, resin printing, transfer molding, a compression molding or the like.

Light Transmissive Member

Figure 1B:
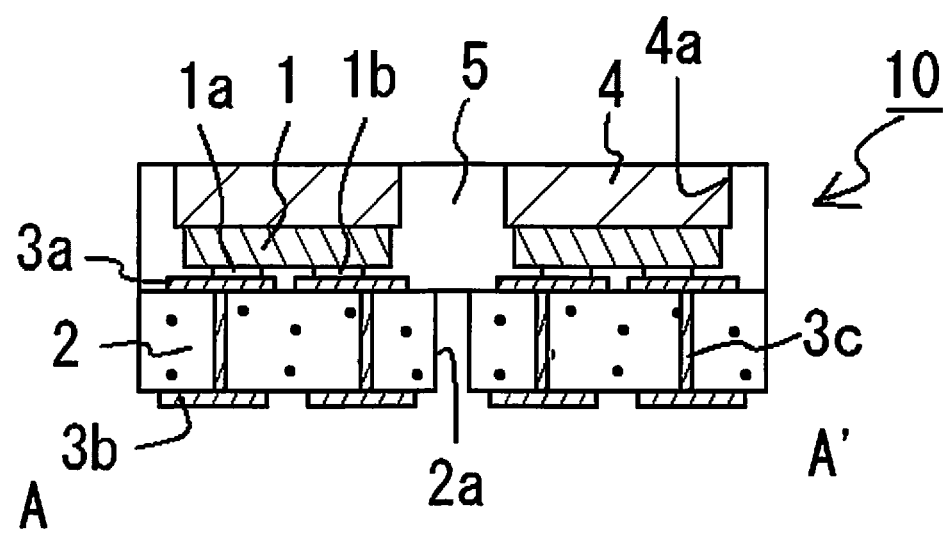
FIG. 1B is a simplified cross section along the A-A' line in FIG. 1A.

The light emitting device also preferably includes a light transmissive member that covers the upper surfaces of the light emitting elements (the light extraction faces) as shown by 4 in FIGS. 1A and 1B). The light transmissive member transmits light emitted from the light emitting elements, and releases this light to the outside.

The light transmissive member preferably covers all of the upper surfaces of the light emitting elements in order for all of the light emitted from the light emitting elements to be extracted. However, the more the light transmissive member is larger than the light emitting elements, the lower may be the luminance of the light extracted. Therefore, the light transmissive member that covers the light emitting elements is preferably the same size as the light emitting elements, to the extent that this is possible. This yields higher luminance, in addition to allowing the light emitting device to be even smaller in size.

When a plurality of light emitting elements are covered by individual light transmissive members that are larger than the light emitting elements, it is preferable for the distance between the light transmissive members to be shorter than the size of the light transmissive members themselves (the length along one side), and more preferably for this distance to be no more than 20% of the size of the light transmissive members themselves. Thus disposing the light transmissive members close together affords a light emitting device that is a planar light source with high emission quality and little emission unevenness.

The light transmissive members may integrally cover the plurality of light emitting elements, or may individually cover the plurality of light emitting elements.

The light transmissive members that individually cover the plurality of light emitting elements preferably have their side surfaces covered by the light reflecting member, just as with the light emitting elements. Consequently, when the light emitting elements are independently driven and lit and unlit states between adjacent light emitting elements, it will be less likely that a light emitting element looks as if a lit state by being subject to light from a lit light emitting element despite the light emitting element is actually unlit state. That is, there will be less light leakage between the light emitting elements.

The outer faces of the light transmissive member that integrally covers the plurality of light emitting elements need not be covered by the light reflecting member, but is preferably covered in consideration of light leakage from the outer faces.

The upper surface side of the light transmissive member is preferably flush with the light reflecting member. This reliably prevents interference between light emitted from the side surfaces of the light transmissive member. It also reliably prevents the interference of light with respect to an adjacent unlit light emitting element.

The thickness of the light transmissive member can be about 50 to 300 μm, for example.

The upper surface of the light transmissive member can have a convex-and-concave shape, a curved surface, a lens shape, or any of a variety of other shapes, and its bottom face is preferably parallel to the light extraction faces of the light emitting elements.

Example of the material forming the light transmissive member include a glass material such as silicate glass, borosilicate glass, quartz glass; resin such as silicone resins, silicone-modified resins, epoxy resins, phenol resins, polycarbonate resins, acrylic resins, trimethylpentene resin, polynorbornene resin, and hybrid resins containing at least one of these resins; and sapphire. The higher is the transparency of the light transmissive member, the more readily will light be reflected at the interface with the light reflecting member, so luminance can be increased.

The light transmissive member may have a phosphor, a light diffusion material, or the like. The phosphor or the light diffusion material may be contained inside the light transmissive member, or a layer containing a phosphor or a light diffusion material may be provided to one or both sides of the light transmissive member. Examples of the method for forming the layer containing a phosphor or a diffusion material may include spraying, electrodeposition, and electrostatic coating. Alternatively, a phosphor sheet or the like composed of a material in which a phosphor is dispersed in a resin may be bonded to the light transmissive member.

The phosphor which convert light into light of a different wavelength by absorbing light emitted from the light emitting element is selected. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate ($CaO-Al_2O_3-SiO_2$)-based phosphors activated by europium and/or chromium, silicate (($Sr,Ba)_2SiO_4$)-based phosphors activated by europium, β-sialon phosphors, chlorosilicate-based phosphors and nitride-based phosphors such as CASN-based or SCASN-based phosphors, rare earth metal nitride-based phosphors, oxynitride-based phosphors, KSF-based phosphors ($K_2SiF_6$:Mn) and sulfide-based phosphors.

Accordingly, there can be provided a light emitting device that emits mixed-color light (e.g. white light) of primary light and secondary light having a visible wavelength, and a light emitting device that is excited by primary light of ultraviolet light to emit secondary light having a visible wavelength. The phosphor may be used in combination of plural kinds of phosphors. Using a desired suitable combination and composition ratio in the color tone, it is possible to adjust the color rendering and color reproducibility.

When the phosphor is included in the light transmissive member, the amount of the phosphor is, for example, preferably about 5 to 50 wt % with respect to the total weight of the light transmissive member.

When the light emitting device having a plurality of light transmissive member, it may be different phosphors of the type and amount to be contained in each of the plurality of light transmissive member.

Using a plurality of combinations of transmissive members containing the different types or combination of phosphors, it is possible to adjust the color rendering and color reproducibility which are suitable for the desired color tone.

The phosphor may be a luminescent material referred to as a so called nanocrystal or quantum dot. Examples of the material thereof include nano-size high-dispersive particles of semiconductor materials, for example group II-VI, group III-V and group IV-VI semiconductors, more specifically CdSe, core-shell type $CdS_XSe_{1-X}/ZnS$, GaP, and InAs. For example, such a phosphor has a particle size of about 1 to 100 nm, preferably about 1 to 20 nm (the number of atoms: about 10 to 50). By using such a phosphor, internal scattering can be suppressed, so that light transmittance can be further improved. By suppressing internal scattering, and light scattering of light color-converted, efficiency of transmitting light can be further enhanced.

An organic light emitting material may be used as the phosphor material. A typical example of an organic light emitting material is a light emitting material in which an organometallic complex is used, and there are many light emitting materials with high light transmittance. Therefore, when an organic light emitting material is used as the phosphor material, the same effect can be obtained as when using a quantum dot phosphor.

Examples of the light diffusion material include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black and the like.

The light transmissive member is joined so as to cover the upper surfaces of the light emitting elements (the light extraction face). The joining can be accomplished, for example, by press-fitting, sintering, bonding with a known adhesive such as an epoxy or silicone, bonding with an organic adhesive with a high refractive index, or bonding with low-melting point glass.

When the light transmissive member and the light emitting elements are joined with an adhesive, the adhesive can contain the above-mentioned phosphor or diffusion material.

When the light transmissive member is joined so as to cover the upper surfaces of the light emitting elements, and particularly when using a light transmissive member that is larger than the light emitting elements, an adhesive may be disposed all the way to the light emitting element side surfaces so that light from the light emitting elements can more easily propagate to the light transmissive member. In this case, the adhesive will end up being disposed between the light reflecting member and the semiconductor layer of the light emitting elements. However, the adhesive is preferably not disposed on the outside from directly under the light transmissive member. This prevents color unevenness and allows light to be properly reflected and propagated between the light emitting elements and the light reflecting member.

Embedded Member

When the light emitting elements are joined on the base, an embedded member is preferably disposed between the base and the light emitting elements. Disposing an embedded member between the base and the light emitting elements improves heat dissipation by absorbing any stress resulting from the difference in the coefficient of thermal expansion between the light emitting elements and the base.

The embedded member may be disposed only directly under the light emitting elements, or may extend from directly under the light emitting elements to between the light emitting elements, or may be in contact with part of the side surfaces of the light emitting elements. The embedded member can have a thickness of about a few microns to a few hundred microns at the thickest part, for example.

The embedded member is what is called an under-filler, usually includes a resin, and preferably is formed by a light reflecting resin. Using a light reflecting resin allows the light emitted downward by the light emitting elements to be reflected, and improves the luminous flux.

The embedded member may be formed from the same material as the light reflecting member, or may be formed from a different material. It is particularly favorable to use a material whose elasticity and/or linear expansion is lower than that of the light reflecting member. This makes it possible to moderate the expansion/contraction stress of the resin at the joint between the light emitting elements and the base, and improves electrical connection reliability. In this case, it is preferable to use a material with high mechanical strength for the light reflecting member, and for the embedded member to be completely covered by the light reflecting member so that the embedded member is not exposed to the outside. This ensures resistance to external stress in the light emitting elements and the embedded member.

When the embedded member and the light reflecting member are made of different materials, it is preferable to cure the embedded member before embedding it in the light reflecting member. This prevents the resins from mixing together, so the performance of each resin is not lost.

The embedded member may be formed using a resin include a resin containing at least one silicone resins, modified silicone resins, epoxy resins, modified epoxy resins, acrylic resins, urea resins, fluorine resins or a hybrid resin thereof, and a light reflecting substance. Of there, a resin containing a silicone resin, epoxy resin, etc. as a base polymer is preferred.

Examples of the light reflecting substance include titanium oxide, silicon oxide, zirconium oxide, magnesium oxide, calcium carbonate, calcium hydroxide, calcium silicate, zinc oxide, barium titanate, potassium titanate, alumina, aluminum nitride, boron nitride and mullite. This makes it possible to reflect light efficiently.

The material that makes up the embedded member may be a single type, or a combination of two or more types. This allows the light reflectivity to be adjusted, and also makes it possible to adjust the coefficient of linear expansion of the resin.

A Zener diode or other such protective element may be mounted in the light emitting device of the present invention. For example, embedding a protective element in the light reflecting member prevents a decrease in light extraction caused by absorption of the light from the light emitting elements by the protective element, or blockage of the light by the protective element.

Method for Manufacturing Light Emitting Device

The above-mentioned light emitting device can be manufactured by the following method.

A base is provided, which has conductive patterns on a first main surface and a second main surface on the opposite side from the first main surface.

A plurality of light emitting elements are mounted on the conductive pattern on the first main surface.

A light reflecting member that integrally covers the side surfaces of the light emitting elements is formed.

At least one groove is formed on the second main surface of the base to correspond to a space between the light emitting elements.

Furthermore, a light transmissive member may be disposed on the upper surfaces of the light emitting elements. This step may be performed before or after the light emitting elements are mounted on the base, or may be performed so that part of the light transmissive member covers or does not cover the upper surface of the light reflecting member after it has been formed.

An embodiment of the light emitting device of the present invention will now be described in detail through reference to the drawings.

Embodiment 1

As shown in FIGS. 1A and 1B, this light emitting device 10 includes a base 2 having conductive patterns 3a and 3b; two light emitting elements 1; and a light reflecting member 5.

The base 2 is formed by a ceramic plate made of aluminum nitride with a thickness of about 400 μm and a thermal conductivity of 170 W/m·k.

The base 2 has a groove 2a that reaches from the second main surface to the first main surface. That is, the base is divided into a plurality of sections. The width of the groove 2a is about 100 μm. The base 2 has the conductive patterns 3a and 3b which are corresponding to a positive and negative pair respectively formed on the first main surface and the second main surface by vapor depositing titanium, platinum, or gold. The conductive pattern 3a on the first main surface and the conductive pattern 3b on the second main surface opposite side from the first main surface are electrically connected through this via 3c.

The light emitting elements 1 are produced by laminating a semiconductor layer over a sapphire substrate, and forming a pair of positive and negative electrodes on the same side. The light emitting elements 1 are each flip-chip mounted with a bump composed of gold, on the conductive pattern 3a of the first main surface of each base 2. Therefore, the sapphire substrate serves as the light extraction face.

The upper surfaces of the light emitting elements are covered by plate-form light transmissive members 4 made of glass in which YAG is dispersed. The light transmissive members 4 contain 5 to 15 wt % YAG phosphor. The size is 1.15 mm×1.15 mm×0.18 mm (thickness). The light transmissive members 4 are bonded to the upper surfaces of the light emitting elements 1 by thermosetting an adhesive composed of a silicone resin.

The distance between adjacent light emitting elements 1 is about 0.5 mm, or about 50% of the length of the longest side of the light emitting elements 1. The distance between adjacent light transmissive members 4 is about 0.4 mm.

The outer periphery of these, including the side surfaces of the light emitting elements 1 and the side surfaces 4a of the light transmissive members 4 covering the upper surfaces of the light emitting elements 1, is covered by the light reflecting member 5. The light reflecting member 5 is disposed directly under the light emitting elements 1, and also in the regions opposite the conductive pattern 3a or the bases 2. The light reflecting member 5 integrates the light emitting elements 1, the bases 2, and the light transmissive members 4.

The light reflecting member 5 contains 30 wt % titanium oxide in a silicone resin, and its thermal conductivity is about 0.2 W/m·k. The light reflecting member 5 is flush with the light transmissive members 4 on the upper surfaces of the light emitting elements 1.

This light emitting device can be manufactured by the following method.

Figure 6A:
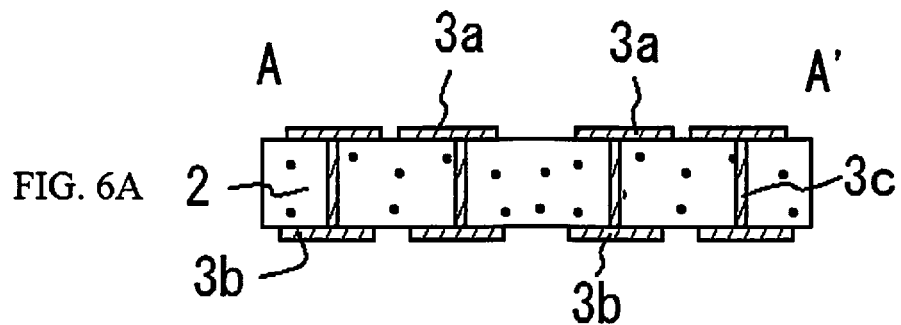
FIGS. 6A to 6D consist of simplified cross sectional step diagrams illustrating the method for manufacturing the light emitting device in Embodiment 1.

First, as shown in FIG. 6A, a flat base 2 having conductive patterns 3a and 3b on the first main surface and the second main surface are prepared.

Figure 6B:
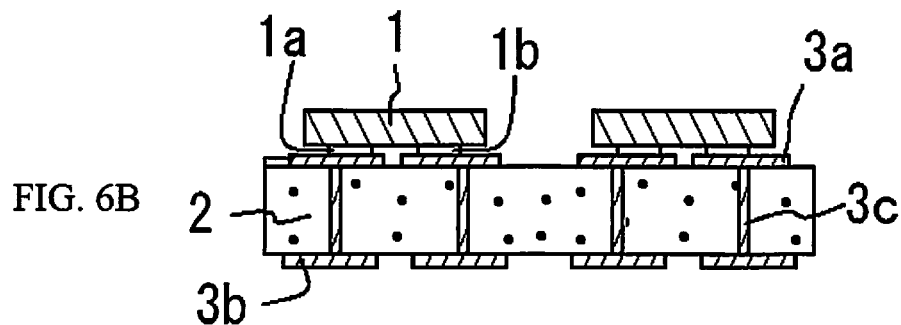

Step 1: As shown in FIG. 6B, a plurality of light emitting elements 1 are mounted over the conductive pattern 3a on the first main surface of the base 2, and electrical connections are made.

Figure 6C:
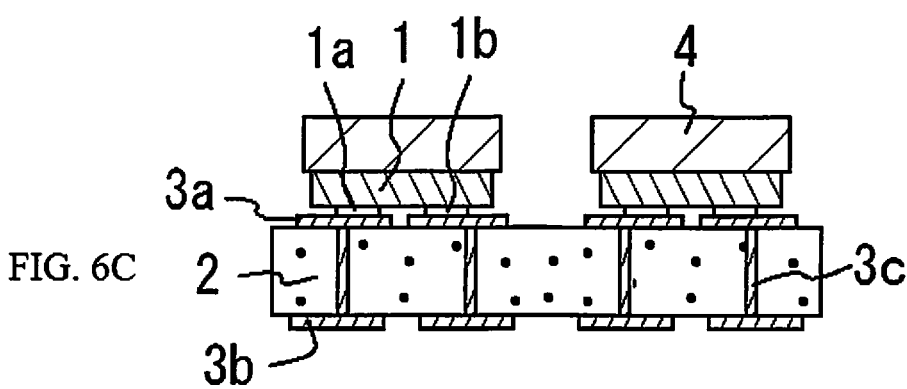
Figure 6D:
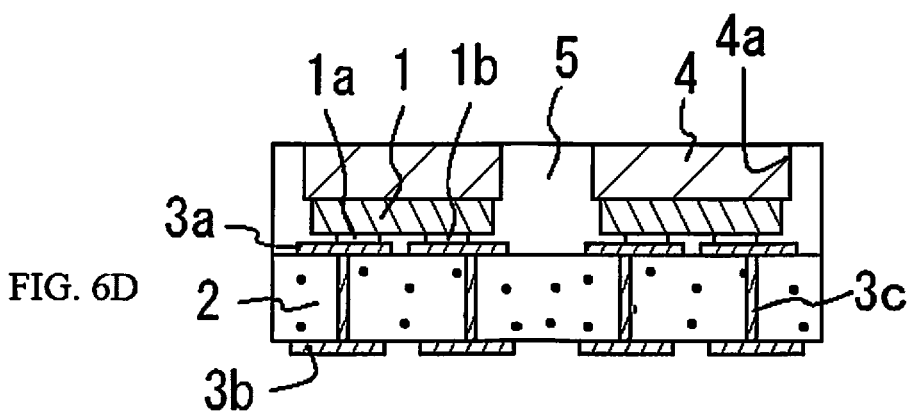

Step 2: Then, as shown in FIG. 6C, light transmissive members 4 are respectively bonded with an adhesive to the upper surfaces of the light emitting elements 1. After this, as shown in FIG. 6D, the side surfaces of the light emitting elements 1 and the side surfaces 4a of the light transmissive members 4 are integrally covered by the light reflecting member 5. The upper surface of the light reflecting member 5 here may be flush with the light extraction faces of the light transmissive members 4, or lower than the light extraction faces. This covering can be accomplished by potting, compression molding, transfer molding, or the like.

The bonding of the light transmissive member 4 with the light emitting elements 1 may be performed before the light emitting elements 1 are mounted on the base 2, or may be performed after the side surface 4a of the light emitting elements 1 is covered with the light reflecting member 5.

Step 3: Next, a blade or the like is used to make a cut in the second main surface side of the base 2 so as to correspond in position between light emitting elements. Here, the groove 2a is formed, as shown in FIG. 1B, by making a cut at the same depth as the thickness of the base 2. The cutting depth here is preferably a depth that reaches the first main surface of the base 2, and preferably does not extend to the light reflecting member 5. This is to prevent the light reflecting member 5 from becoming a partial thin-film, and prevent light from leaking out from that site.

Step 4: The light emitting device is separated into the desired constituent units (two light emitting elements in this case) by using a blade.

Figure 1C:
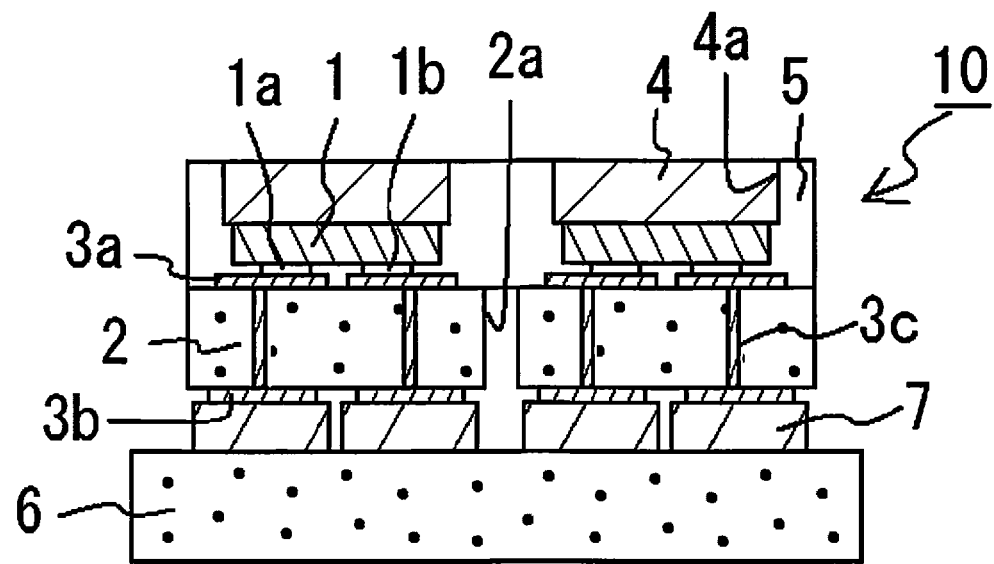
FIG. 1C is a simplified cross section showing the state when the light emitting device in FIG. 1A is mounted on a mounting board.

After this, as shown in FIG. 1C, for example, electrical connections are made with a joining member composed of solder on a mounting board having a circuit pattern on its surface, so that the product can be used in a variety of applications.

Usually, when a light emitting device such as this is formed, a composite base is used in which a plurality of constituent units of a single light emitting device are integrally provided. When ease of work is taken into account in the above-mentioned method for manufacturing a light emitting device, the steps 1 and 2 are performed for a composite base, but step 4 is not limited to coming after the step 3, and may instead be performed before step 3.

Thus, the two emission surfaces (light emitting elements) had by a single light emitting device can be mounted at high density on a mounting board by means of the following number of steps: mounting the light emitting elements on a composite board (two times), separating into individual light emitting devices in a state in which two light emitting elements are linked (one time), and mounting a light emitting device in which two light emitting elements are linked on a mounting board (one time).

Since the number of steps can be reduced as compared to a conventional process involving mounting light emitting elements on a composite board (two times), separating the composite board into individual units (two times), and mounting the individual light emitting devices on a mounting board (two times), the positional accuracy of the emission surfaces on the mounting board can be markedly improved. This is because when steps are added on, the variance in each of the steps (in the accuracy of mounting the light emitting elements, the cutting accuracy during separation into units, and the mounting accuracy for each individual light emitting device) increases the amount of positional variance in the emission surfaces in mounting as a finished product.

Thus, in the process of separation into units and in the process of mounting a light emitting device on a mounting board, in which variance in accuracy is expected to occur, when the variance in each step can be avoided or reduced, the result will be a light emitting device with higher reliability, without discontinuity, shorting, or other such problems, and in which good luminance distribution, heat dissipation, and the like are ensured, while the plurality of emission surfaces (light emitting elements) are arranged uniformly and as closely together as possible.

Embodiment 2

Figure 2:
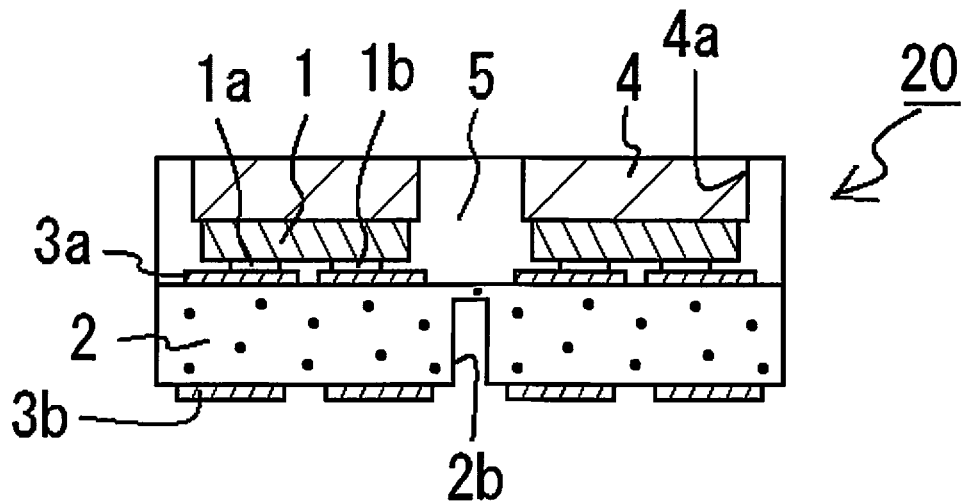
FIG. 2 is a simplified cross section of the light emitting device in Embodiment 2 of the present disclosure.

As shown in FIG. 2, this light emitting device 20 has a groove 2b formed only part of the way in the thickness direction of the base from the second main surface side of the base 2. That is, the base 2 has the groove 2b that does not reach the first main surface of the base 2, which means that the configuration is the same as in the light emitting device 10, except that the base 2 is in the form of being linked as a single member.

The light emitting device 20 has the same effect as the light emitting device 10.

Furthermore, the base 2 has the groove 2b and is linked in the thickness direction of the base 2, but this linking can be easily separated by the stress produced by expansion or contraction of the light emitting elements themselves, the base itself, and/or the joining member itself. This allows the stress to be easily absorbed or moderated.

Embodiment 3

Figure 3:
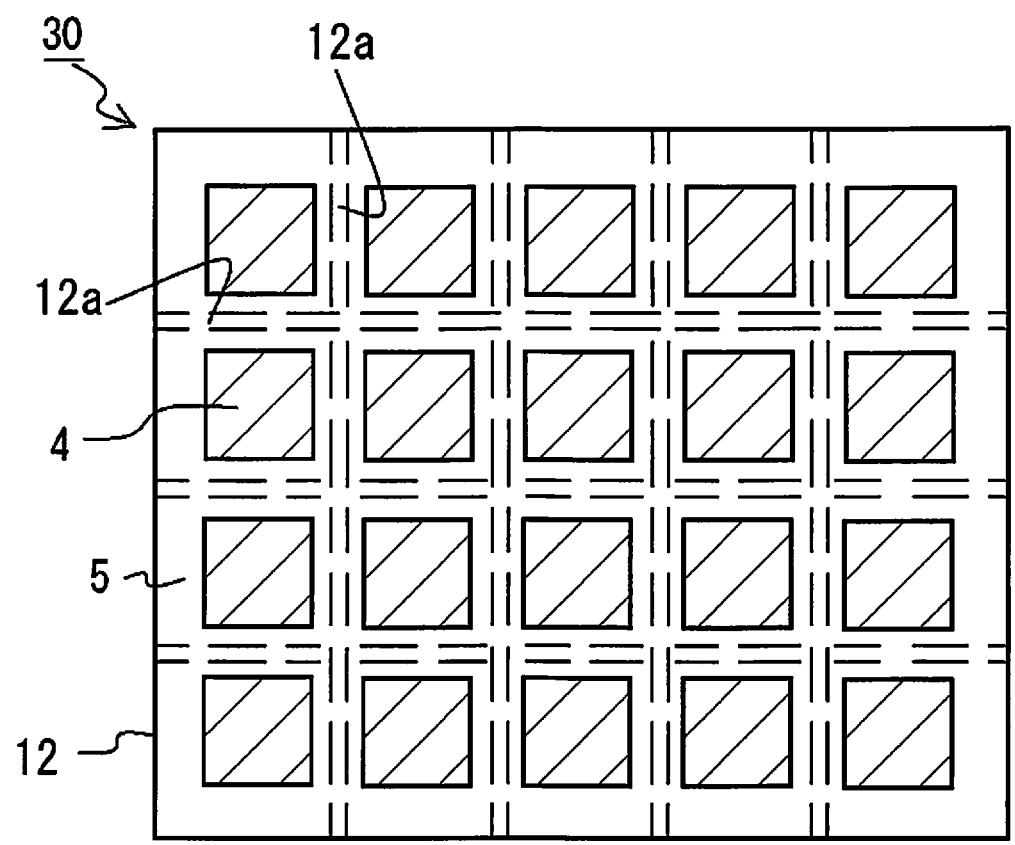
FIG. 3 is a simplified plan view of the light emitting device in Embodiment 3 of the present disclosure.

As shown in FIG. 3, this light emitting device 30 includes a base 12 having a plurality of conductive patterns; a plurality of light transmissive members, a plurality of light emitting elements 1 covered by the light transmissive member 4 and a light reflecting member 5. The light emitting elements 1 are arranged in a matrix. In this case, grooves 12a in the base 12 are formed in a lattice shape so as to surround the light emitting elements, in between the light emitting elements that are disposed in a matrix. The grooves 12a include grooves extending in columns and the grooves extending in rows, and the widths of these may be different, but in consideration of ease of work during formation, the widths are preferably the same.

Usually, the layout of the emission surfaces of each light emitting device on a mounting board is determined according to the light distribution design, so when there is much positional variance in the emission surfaces of light emitting devices mounted on a mounting board, the desired light distribution pattern cannot be formed.

On the other hand, with the light emitting device in this embodiment, since it is possible to markedly reduce positional variance in the emission surfaces had by the light emitting device, mounting can be performed so that the position and orientation of the emission surfaces are as intended and according to the desired light distribution design, and the above-mentioned effect can be effectively obtained.

Furthermore, when the light emitting elements are arranged in a matrix and grooves are provided in a lattice shape in the base, the light emitting device can have flexibility, and this allows it to be mounted on mounting boards of any desired shape.

Separation Evaluation

The lighting defect rate after a heat cycle test was examined in order to test for separation of the light emitting device pertaining to an embodiment of the present invention.

The light emitting devices used for this measurement included 1a) a sample in which the base were separated between the light emitting elements of a light emitting device in which five light emitting elements were linked in a single row, 1b) a sample in which the base were separated between the light emitting elements of a light emitting device in which ten light emitting elements were linked in a single row, 1c) a sample in which the base were separated between the light emitting elements of a light emitting device in which five rows of ten light emitting elements each (5×10) were linked, 2a) a sample in which five light emitting elements were linked in a single row, 2b) a sample in which ten light emitting elements were linked in a single row, and 2c) a sample in which five rows of ten light emitting elements each were linked.

As shown in FIG. 1C, these light emitting devices were electrically connected by a joining member composed of solder on a mounting board having a circuit pattern on its surface, a load was applied by heat cycling in which the temperature was repeatedly changed between −40° C. and 125° C., and the occurrence of non-lighting was checked for each sample. As a result, after undergoing 400 test cycles, no instances of non-lighting were found in samples 1a, 1b, and 1c, in which the base portions were separated between light emitting elements. As to the samples in which the bases were linked, non-lighting happened in 0 out of 14 samples in the case 2a), 3 out of 10 samples in the case 2b), and 6 out of 6 samples in the case 2c). After undergoing 560 test cycles, the samples in which the bases were linked, it was confirmed that non-lighting happened to 9 out of 10 in the case 2b) increased by 6 samples. No instances of non-lighting were seen in samples 1a), 1b), and 1c), in which the base portions were separated between light emitting elements. Furthermore, after undergoing 1040 test cycles, no instances of non-lighting were seen in samples 1a), 1b), and 1c), in which the base portions were separated between light emitting elements. As to the samples in which the bases were linked, non-lighting happened in 6 out of 14 samples in the case 2a), 9 out of 10 samples in the case 2b), and 6 out of 6 samples in the case 2c).

Thus, with the light emitting device pertaining to an embodiment of the present invention, it is considered that joining defects caused when the base expands and contracts in response to temperature changes can be reduced by grooves between the bases. It is also confirmed that the larger the base is, the more the number of joining defects are caused by temperature changes.

Mounting a plurality of light emitting elements makes it possible to design the emission surfaces in the desired shape according to how the light emitting elements are arranged, and this affords broader application. Because the base on which the light emitting elements are mounted has a groove, and the base is split up, tiny movements, warpage, and so forth are possible in the base itself. Consequently, expansion and contraction of the base (the conductive pattern and/or the base body) attributable to heat generated by the individual light emitting elements, the thermal hysteresis during mounting, and so on, the expansion and contraction of the joining member that links the light emitting elements and the base, and the like can be absorbed or released in individual base units. As a result, joining defects such as separation and the like between materials attributable to expansion and contraction inherent to the materials that make up the light emitting elements, the base, the joining member, and so on can be prevented.

That is, even with a light emitting device that is relatively large in size, a groove between bases allows thermal expansion and contraction between the light emitting elements, the base body, the joining member, the mounting board, and so forth caused by heat cycling to be effectively absorbed or released, which ensures better reliability.

Embodiment 4

Figure 4A:
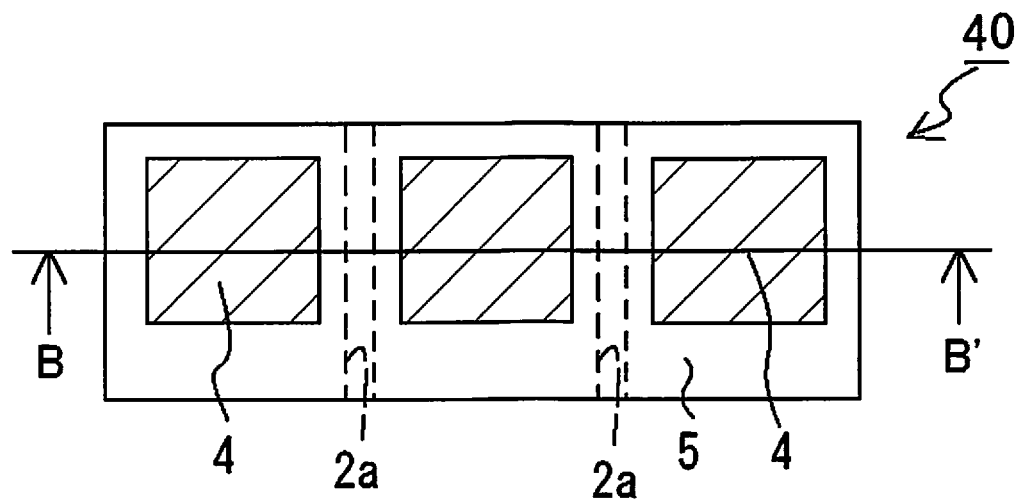
FIG. 4A is a simplified plan view of the light emitting device in Embodiment 4 of the present disclosure.
Figure 4B:
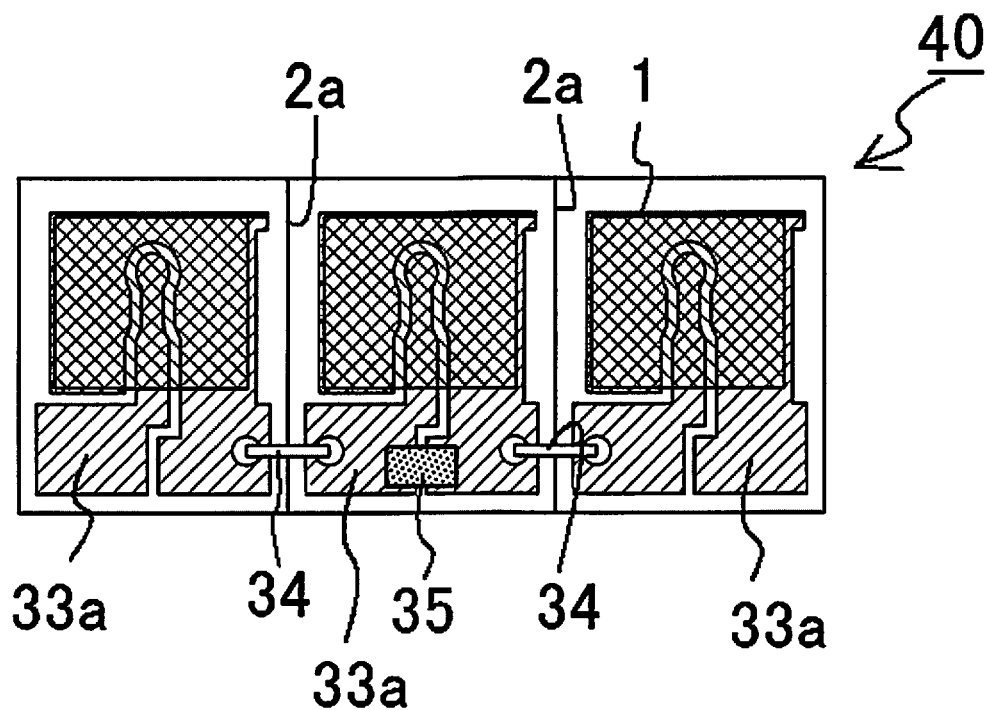
FIG. 4B is a simplified plan view showing an of internal structure of the light emitting device in Embodiment 4 of the present disclosure.
Figure 4C:
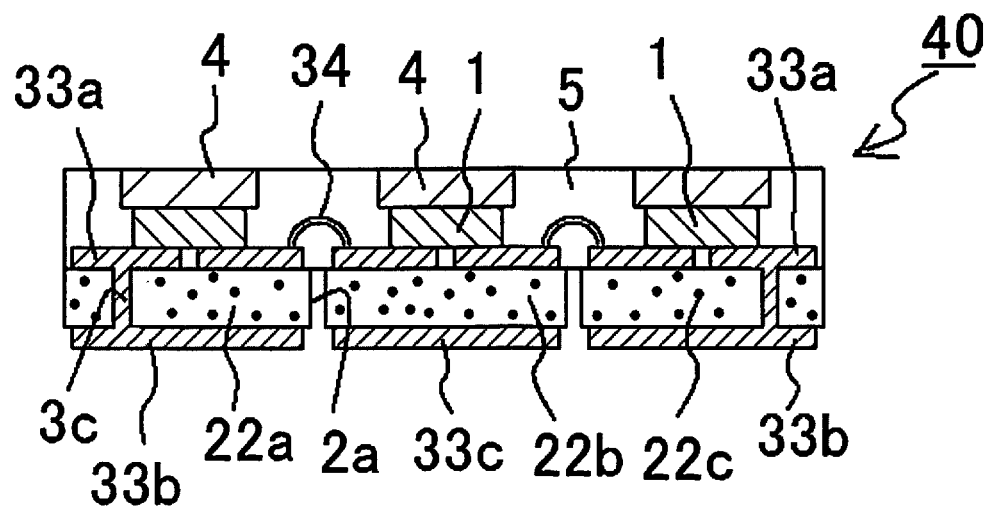
FIG. 4C is a simplified cross section along the A-A' line in FIG. 4A.

As shown in FIGS. 4A to 4C, this light emitting device 40 includes bases 22a, 22b, 22c having conductive patterns 33a; a plurality of light emitting elements 1 respectively mounted on the conductive patterns 33a; a plurality of light transmissive members 4 respectively covering light emitting elements 1; a light reflecting member 5 integrally covering the side surfaces of the light emitting elements 1; and a protective element 35.

The bases 22a, 22b, and 22c are separated by grooves, and the conductive patterns 33a of the bases 22a, 22b, 22c are electrically connected by wires 34. The wires 34 are embedded in the light reflecting member 5 so as not to be exposed on the outer surface of the light emitting device 40. The light emitting device 40 is integrally formed with light reflecting member 5 and the wires 34.

The bases 22a and 22c, which are disposed on either end of the light emitting device, have conductive patterns on the second main surface on the opposite side from the first main surface. The conductive patterns 33b are electrically connected through vias 3c embedded in the base body with the conductive pattern 33a on the first main surface, and function as the external electrodes of the light emitting device 40.

The base 22b on the middle of the light emitting device 40 has a heat dissipation pattern 33c, which is electrically independent from the conductive member 32a on the first main surface and plurality of the light emitting elements 1.

The rest of the configuration is the same as that of the light emitting device 10.

With this configuration of the light emitting device 40, the conductive patterns 33a and 33b function as a pair of external electrodes for the light emitting device 40, and the plurality of light emitting elements can be driven all at once. Also, since the heat dissipation pattern 33c, which has no electric potential, can be disposed on the second main surface side of the bases 22b, a light emitting device with particularly good heat dissipation can be obtained. In general, more heat tends to be trapped nearer the center of a light emitting device, so with a light emitting device including a plurality of light emitting elements, superior heat dissipation can be obtained by providing a heat dissipation pattern specialized for heat dissipation in the region directly under the light emitting element disposed near the center of the light emitting device. From the standpoint of heat dissipation, the heat dissipation pattern is preferably larger than the light emitting element disposed directly above in plan view. Furthermore, it is preferable for the outer edge of the light emitting element to be included within the heat dissipation pattern in plan view.

Three light emitting elements are included in the light emitting device 40 as shown in FIGS. 4A to 4C, but the number of light emitting elements is not limited to three, and may be four or more instead. More than four light emitting elements may be disposed in a matrix as with the light emitting device 30 of FIG. 3.

When a plurality of light emitting elements are disposed in a matrix as shown in FIG. 3 and are driven all at once, more heat tends to be trapped nearer the center of a light emitting device, and heat dissipation might be decreased. In response to this, the region directly under the light emitting element located at the center of the light emitting device in particular can be given a pattern specialized for heat dissipation, which has no electric potential, this ensures good heat dissipation at the center of the light emitting device.

Further, the groove between bases allows thermal expansion and contraction between the light emitting elements, the base body, the joining member, the mounting board, and so forth caused by heat cycling to be effectively absorbed or released, which ensures better reliability.

Embodiment 5

Figure 5:
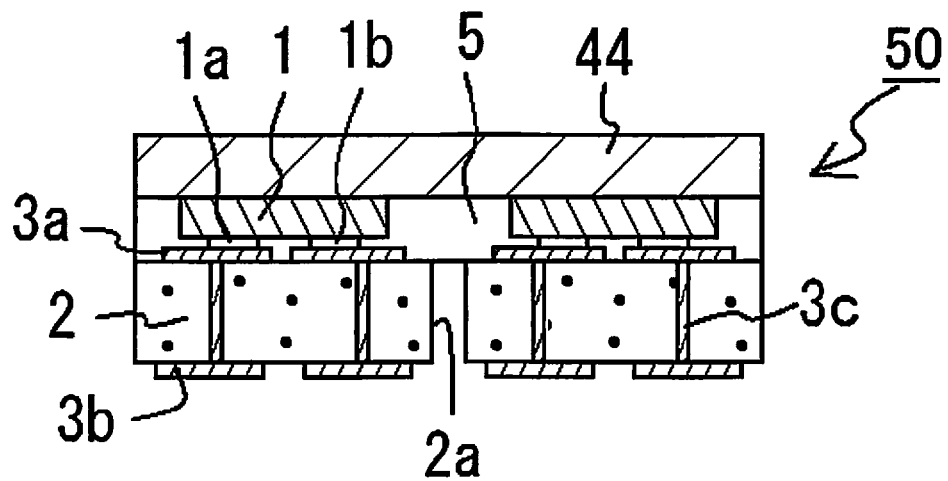
FIG. 5 is a simplified cross section of the light emitting device in Modified Embodiment of the present disclosure.

As shown in FIG. 5, this light emitting device 50 has a light transmissive member disposed integrally on a plurality of light emitting elements.

The rest of the configuration is the same as that of the light emitting device 40.

With the configuration of this light emitting device 50, a planar-emission light emitting device can be obtained with which a plurality of light emitting elements can be driven all at once and there is a large emission surface area.

INDUSTRIAL APPLICABILITY

The light emitting device of the present invention can be used for various kinds of light sources for lighting fixtures, indicators, display, backlight of the liquid crystal displays as well as light source equipped with a vehicle, signals, in-vehicle products, display devices such as advertisements, in particular it is preferable to use for light source equipped in a vehicle such as headlight, rear lamp, day lighting (DRL) and the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:
1. A light emitting device comprising:
a plurality of light emitting elements,
a base having a first main surface and a second main surface on the opposite side from the first main surface, the base having conductive patterns disposed on the first main surface on which the light emitting elements are mounted, conductive patterns disposed on the second main surface, and a hollow groove provided on the second main surface of the base corresponding to a space between an adjacent pair of the light emitting elements, and
a light reflecting member that integrally covers side surfaces of the plurality of light emitting elements and joins the plurality of light emitting elements together,
the first main surface of the base being substantially coplanar with a bottom surface of the light reflecting member,
the base including vias and a base body, the vias corresponding to the conductive patterns disposed on the first and second main surfaces, the base body being formed based on an insulating material whose thermal conductivity is higher than that of the light reflecting member, and
the conductive patterns disposed on the first main surface being electrically connected to the conductive patterns disposed on the second main surface through the vias, respectively.

2. The light emitting device according to claim 1, wherein the light reflecting member covers the side surfaces of the light emitting elements and at least part of the first main surface of the base.

3. The light emitting device according to claim 1, wherein the base body is composed of ceramics.

4. The light emitting device according to claim 1, wherein the groove reaches the first main surface of the base.

5. The light emitting device according to claim 1, wherein the light emitting elements are arranged in a matrix.

6. The light emitting device according to claim 1, further comprising
a light transmissive member that covers an upper surface of at least one of the light emitting elements,
a side surface of the light transmissive member being covered by the light reflecting member.

7. The light emitting device according to claim 1, wherein the light reflecting member includes a resin.

8. The light emitting device according to claim 6, wherein the light reflecting member includes a resin.

9. The light emitting device according to claim 8, wherein the light transmissive member and the light reflecting member are flush on an upper surface side.

10. The light emitting device according to claim 1, wherein
distance between opposing edges of the light emitting elements is about 5 to 50% of a length of the longest side of the light emitting elements.

11. The light emitting device according to claim 6, wherein
the light transmissive member includes a phosphor.

12. A light emitting device comprising:
a plurality of light emitting elements,
a base having a first main surface and a second main surface on the opposite side from the first main surface, the base having conductive patterns disposed on the first main surface on which the light emitting elements are mounted, conductive patters disposed on the second main surface, and a hollow groove provided on the second main surface of the base corresponding to a space between an adjacent pair of the light emitting elements, and
a light reflecting member that integrally covers side surfaces of the plurality of light emitting elements and joins the plurality of light emitting elements together, the first main surface of the base being substantially coplanar with a bottom surface of the light reflecting member,
the plurality of light emitting elements being configured to be independently driven.

13. The light emitting device according to claim 12, wherein
the light reflecting member covers the side surfaces of the light emitting elements and at least part of the first main surface of the base.

14. The light emitting device according to claim 12, wherein
the base body is composed of ceramics.

15. The light emitting device according to claim 12, wherein
the groove reaches the first main surface of the base.

16. The light emitting device according to claim 12, wherein
the light emitting elements are arranged in a matrix.

17. The light emitting device according to claim 12, further comprising
a light transmissive member that covers an upper surface of at least one of the light emitting elements,
a side surface of the light transmissive member being covered by the light reflecting member.

18. The light emitting device according to claim 12, wherein
the light reflecting member includes a resin.

19. The light emitting device according to claim 17, wherein
the light reflecting member includes a resin.

20. The light emitting device according to claim 19, wherein
the light transmissive member and the light reflecting member are flush on an upper surface side.

21. The light emitting device according to claim 12, wherein
distance between opposing edges of the light emitting elements is about 5 to 50% of a length of the longest side of the light emitting elements.

22. The light emitting device according to claim 17, wherein
the light transmissive member includes a phosphor.

* * * * *